(12) United States Patent
Wang et al.

(10) Patent No.: US 12,349,510 B2
(45) Date of Patent: Jul. 1, 2025

(54) LIGHT-EMITTING DIODE, LIGHT-EMITTING DIODE PACKAGED MODULE AND DISPLAY DEVICE INCLUDING THE SAME

(71) Applicant: XIAMEN SANAN OPTOELECTRONICS CO., LTD., Xiamen (CN)

(72) Inventors: Qing Wang, Xiamen (CN); Quanyang Ma, Xiamen (CN); Dazhong Chen, Xiamen (CN); Ling-Yuan Hong, Xiamen (CN); Kang-Wei Peng, Xiamen (CN); Su-Hui Lin, Xiamen (CN)

(73) Assignee: XIAMEN SANAN OPTOELECTRONICS CO., LTD., Xiamen (CN)

( * ) Notice: Subject to any disclaimer, the term of this patent is extended or adjusted under 35 U.S.C. 154(b) by 857 days.

(21) Appl. No.: 17/303,153

(22) Filed: May 21, 2021

(65) Prior Publication Data
US 2021/0280743 A1    Sep. 9, 2021

Related U.S. Application Data

(63) Continuation-in-part of application No. PCT/CN2019/125580, filed on Dec. 16, 2019.

(51) Int. Cl.
*H01L 33/10* (2010.01)
*H01L 27/15* (2006.01)
(Continued)

(52) U.S. Cl.
CPC .......... *H10H 20/814* (2025.01); *H10H 20/82* (2025.01); *H10H 20/8312* (2025.01);
(Continued)

(58) Field of Classification Search
CPC ............ H01L 33/10–105; H01L 25/03; H01L 25/075; H01L 25/0753; H10H 29/142;
(Continued)

(56) References Cited

U.S. PATENT DOCUMENTS

2009/0303487 A1*  12/2009  Bond .................. H01S 5/18361
                                                              372/20
2012/0074441 A1*  3/2012  Seo .......................... H01L 33/42
                                                              257/E33.068
(Continued)

FOREIGN PATENT DOCUMENTS

CN    104064634 A    9/2014
CN    105932120 A    9/2016
(Continued)

OTHER PUBLICATIONS

Search Report Issued to PCT Application No. PCT/CN2019/125580 by the WIPO on Aug. 31, 2020.

*Primary Examiner* — Julio J Maldonado
*Assistant Examiner* — Stanetta D Isaac
(74) *Attorney, Agent, or Firm* — MUNCY, GEISSLER, OLDS & LOWE, P.C.

(57) ABSTRACT

A light-emitting diode (LED) includes a transmissible substrate, an epitaxial layered structure, a distributed Bragg reflector (DBR) structure, a first electrode, and a second electrode. The epitaxial layered structure is disposed on the transmissible substrate. The DBR structure is disposed on the epitaxial layered structure opposite to the transmissible substrate. The DBR structure has at least one first through hole and at least one second through hole, and is formed with a plurality of voids. The first electrode and the second electrode are electrically connected to the first semiconduc-
(Continued)

tor layer and the second semiconductor layer, respectively. An LED packaged module including the LED is also disclosed.

20 Claims, 7 Drawing Sheets

(51) Int. Cl.
| | |
|---|---|
| *H01L 33/22* | (2010.01) |
| *H01L 33/38* | (2010.01) |
| *H01L 33/46* | (2010.01) |
| *H01L 33/48* | (2010.01) |
| *H10H 20/814* | (2025.01) |
| *H10H 20/82* | (2025.01) |
| *H10H 20/831* | (2025.01) |
| *H10H 20/841* | (2025.01) |
| *H10H 20/85* | (2025.01) |
| *H10H 29/14* | (2025.01) |

(52) U.S. Cl.
CPC ...... *H10H 20/841* (2025.01); *H10H 20/8506* (2025.01); *H10H 29/142* (2025.01)

(58) Field of Classification Search
CPC .. H10H 20/814; H10H 20/82; H10H 20/8312; H10H 20/841; H10H 20/8506; H10H 20/831
See application file for complete search history.

(56) References Cited

U.S. PATENT DOCUMENTS

2020/0144326 A1\* 5/2020 Lee .................. H01L 33/62
2020/0152691 A1\* 5/2020 Lee .................. H01L 33/382

FOREIGN PATENT DOCUMENTS

| CN | 106848016 A | 6/2017 |
|---|---|---|
| CN | 106848838 A | 6/2017 |
| CN | 109742210 A | 5/2019 |
| CN | 110165551 A | 8/2019 |

\* cited by examiner

LIGHT-EMITTING DIODE, LIGHT-EMITTING DIODE PACKAGED MODULE AND DISPLAY DEVICE INCLUDING THE SAME

CROSS-REFERENCE TO RELATED APPLICATION

This application is a bypass continuation-in-part (CIP) application of PCT International Application No. PCT/CN2019/125580, filed on Dec. 16, 2019. The entire content of the international patent application is incorporated herein by reference.

FIELD

The disclosure relates to a semiconductor optoelectronic device, and more particularly to a light-emitting diode.

BACKGROUND

Light-emitting diode (LED) is considered as one of the light sources which has the most potential because of its high luminous intensity, high luminous efficiency, small volume and long service life. LED has been widely used in many aspects such as lighting, indicators and signs, backlight sources, vehicle lamps and monitor displays, etc., and thus, there is an urge to further improve its properties such as brightness and luminous efficiency.

There are three common types of LED, namely, flip-chip LED, face-up LED and vertical LED. Flip-chip LED is developed to overcome limitations of face-up LED, i.e., failure to adapt to high current application due to its high thermal resistance and poor heat dissipation ability. A reflective structure used in a conventional flip-chip LED is made of silver, i.e., reflective silver mirror, Yet, is prone to migration. Therefore, the silver reflective silver mirror usually has an area smaller than that of a light-emitting structure, and a protection layer is required to be further formed on a portion of the light-emitting structure to cover the silver reflective mirror. Moreover, the silver reflective mirror at most reaches a reflectivity of around 95%. As such, the conventional flip-chip LED with the silver reflective mirror has shortcomings, such as a relatively small reflection area and low reflectivity, which might greatly reduce light extraction efficiency, and is not conducive to achieve an increase in luminous efficiency.

SUMMARY

Therefore, an object of the disclosure is to provide a light-emitting diode (LED), an LED packaged module and a display device that can alleviate at least one of the drawbacks of the prior art.

According to the disclosure, the LED includes a transmissible substrate which has a first surface, an epitaxial layered structure, a distributed Bragg reflector (DBR) structure, a first electrode, and a second electrode.

The epitaxial layered structure includes a first semiconductor layer, an active layer and a second semiconductor layer that are sequentially disposed on the first surface of the transmissible substrate in such order.

The DBR structure is disposed on the epitaxial layered structure opposite to the transmissible substrate, and has at least one first through hole and at least one second through hole. The DBR structure is formed with a plurality of voids.

The first electrode and the second electrode are electrically connected to the first semiconductor layer and second semiconductor layer the respectively through the first through hole and the second through hole.

According to the disclosure, the LED packaged module includes a mounting board 30, and at least one LED as mentioned above which is mounted on the mounting board 30.

According to the disclosure, the display device includes the abovementioned LED packaged module.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
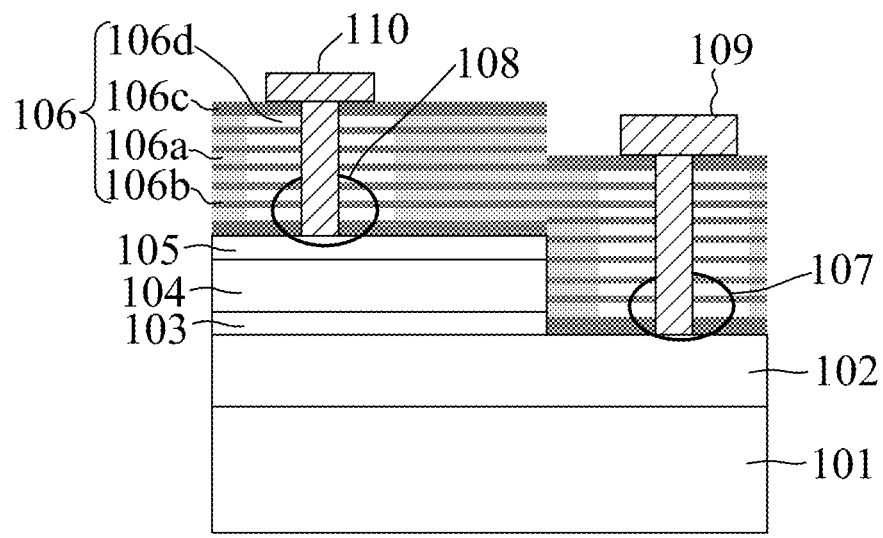
FIG. 1 is a sectional view illustrating a first embodiment of a light-emitting diode (LED) according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, a first embodiment of a light-emitting diode (LED) according to the disclosure includes a transmissible substrate 101, an epitaxial layered structure, a distributed Bragg reflector (DBR) structure 106, a first electrode 109, and a second electrode 110.

The transmissible substrate 101 may be an insulating substrate or a conducting substrate that allows growth of the epitaxial layered structure. Examples of a material for making the transmissible substrate 101 may include, but are not limited to, sapphire, silicon carbide, a silicon-based material, a gallium nitride-based material, and an aluminum nitride-based material.

The transmissible substrate 101 has a first surface, and a second surface that is opposite to the first surface. The second surface is a light-exiting surface of the LED. The transmissible substrate 101 may include a plurality of protrusion which are formed on a portion of the first surface, and which cooperate to form a regular or irregular pattern. In this embodiment, the transmissible substrate 101 is a patterned sapphire substrate.

The transmissible substrate a 101 may have thickness ranging from 40 μm to 300 μm. In certain embodiments, the thickness of the transmissible substrate 101 ranges from 80

μm to 300 μm. In other embodiments, the thickness of the transmissible substrate 101 ranges from 40 μm to 80 μm, such as ranging from 40 μm to 60 μm.

The epitaxial layered structure includes a first semiconductor layer 102, an active layer 103 and a second semiconductor layer 104 that are sequentially disposed on the transmissible substrate 101 in such order. In certain embodiments, the epitaxial layered structure is bonded to the transmissible substrate 101 through a transmissible bonding layer.

Each of the first semiconductor layer 102 and the second semiconductor layer 104 may be made of a semiconductor material such as a group III-V material or a group II-VI material.

The semiconductor material for making the first semiconductor layer 102 may have a chemical formula represented by $In_{X1}Al_{Y1}Ga_{1-X1-Y1}N$, where $0 \leq X1 \leq 1$, $0 \leq Y1 \leq 1$, and $0 \leq X1+Y1 \leq 1$. Examples of such semiconductor material may include, but are not limited to, GaN, AlGaN, InGaN, InAlGaN, etc.

The semiconductor material for making the second semiconductor layer 104 may have a chemical formula represented by $In_{X2}Al_{Y2}Ga_{1-X2-Y2}N$, where $0 \leq X2 \leq 1$, $0 \leq Y2 \leq 1$, and $0 \leq X2+Y2 \leq 1$. Examples of such semiconductor material may include, but are not limited to, AlInN, AlGaAs, GaP, GaAs, GaAsP, AlGaInP, etc.

In addition, the first semiconductor layer 102 and the second semiconductor layer 104 may be respectively doped with a first dopant and a second dopant that is opposite in conductivity to the first dopant. For instance, the first dopant is an n-type dopant (i.e., the first semiconductor layer 102 is an n-type semiconductor layer), and the second dopant is a p-type dopant (i.e., the second semiconductor layer 104 is a p-type semiconductor layer), and vice versa. Examples of the n-type dopant may include, but are not limited to, Si, Ge, Sn, Se, and Te. Examples of the p-type dopant may include, but are not limited to, Mg, Zn, Ca, Sr, and Ba.

The active layer 103 is a region for radiative recombination of electrons and holes from the first and second semiconductor layers 102 and 104. The active layer 103 may be formed as one of a single-well structure, a multiple-well structure, a single-quantum-well structure or a multiple-quantum-well structure. In certain embodiments, the active layer 103 includes a potential well layer and a potential barrier layer which has a band gap larger than that of the potential well layer.

The epitaxial layered structure may be formed with at least one recess which extends through the second semiconductor layer 104 and the active layer 103 to partially expose the first semiconductor layer 102. In other words, the active layer 103 and the second semiconductor layer 104 cooperate to form at least one platform (i.e., mesa structure) which is disposed on a portion of the first semiconductor layer 102, as shown in FIG. 1.

The distributed Bragg reflector (DBR) structure 106 is disposed on the epitaxial layered structure opposite to the transmissible substrate 101. In certain embodiments, the DBR structure 106 covers a top surface of the second semiconductor layer 104 and side walls of the platform of the epitaxial layered structure. A majority (such as at least 80%, at least 90%, or at least 99%) of light emitted from the active layer 103 and reaching the DBR structure 106 is reflected by the DBR structure 106, and transmits through the epitaxial layered structure, and then exits outside of the LED from the second surface of the transmissible substrate 101. As such, light exiting through the top surface and side walls of the epitaxial layered structure (i.e., light loss) can be greatly reduced.

The DBR structure 106 may be made of an insulating dielectric material. In this embodiment, the DBR structure 106 includes a plurality of pairs of dielectric layers. Each pair of the dielectric layers includes a first dielectric layer 106a and a second dielectric layer 106b which has a refractive index greater than that of the first dielectric layer 106a. The first dielectric layers 106a and the second dielectric layers 106b in the DBR structure 106 are alternately-stacked. In certain embodiments, the DBR structure 106 includes 3 to 50 pairs of dielectric layers. For each of the pairs of dielectric layers, the first dielectric layer 106a may have a thickness larger than that of the second dielectric layer 106b.

Examples of a material for making the first dielectric layers 106a may include, but are not limited to, silicon dioxide ($SiO_2$); silicon oxynitride, silicon nitride, and combinations thereof. Examples of a material for making the second dielectric layers 106b may include, but are not limited to, titanium dioxide ($TiO_2$), niobium pentoxide, tantalum pentoxide, and combinations thereof. In this embodiment, for each of the pairs of dielectric layers, the first dielectric layer 106a is made of $SiO_2$ having a refractive index of 1.46, and the second dielectric layer 106b is made of $TiO_2$ having a refractive index of 2.5.

Figure 2:
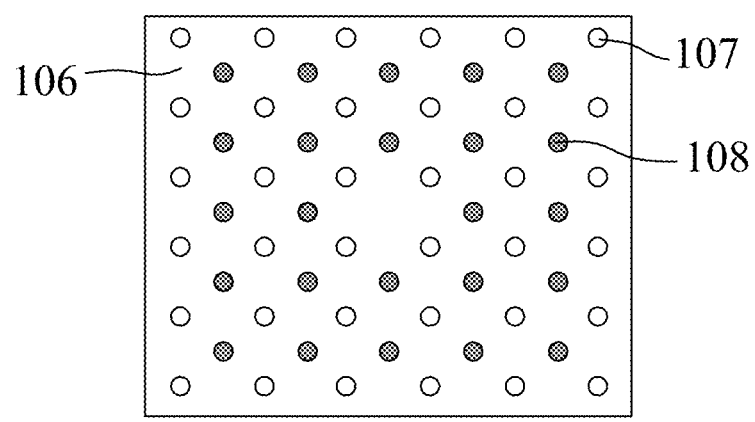
FIG. 2 is a schematic view illustrating a DBR structure of the first embodiment which has first through holes and second through holes.

In addition, the DBR structure 106 has at least one first through hole 107 and at least one second through hole 108 which are respectively filled with the first electrode 109 and the second electrode 110. As shown in FIG. 2, the DBR structure 106 may have a plurality of the first through holes 107 and a plurality of the second through holes 108. For example, each of the number of the first through holes 107 and the number of second through holes 108 is not less than 3, such as at least 5 or 10. In addition, the first through holes 107 may be equally spaced apart from one another, the second through holes 108 may be equally spaced apart from one another, and/or the first through holes 107 may be equally spaced apart from adjacent ones of the second through holes 108.

The DBR structure 106 is formed with a plurality of voids 106d. In this embodiment, the voids 106d are only formed in the first dielectric layers 106a. The voids 106d are partially embedded in the first dielectric layer 106a, and are communicated in space with the first through holes 107 and the second through holes 108. Each of the voids 106d may have a diameter in micrometer-scale, such as ranging from 1 μm to 50 μm.

Since the voids 106d in the first dielectric layer 106a are filled with air that has a refractive index of 1 (lower than the material for making the first dielectric layer 106a), the first dielectric layers 106a will have a reduced refractive index, which may result in a greater difference of refractive index with the second dielectric layer 106b, and a further enhanced reflectivity of the DBR structure 106, thereby improving the light emitting efficiency of the LED. In addition, the DBR structure 106 may entirely cover a region other than the light-exiting surface of the LED, so as to increase the area for reflection, thereby further improving light extraction efficiency and light emitting efficiency of the LED.

Figure 3:
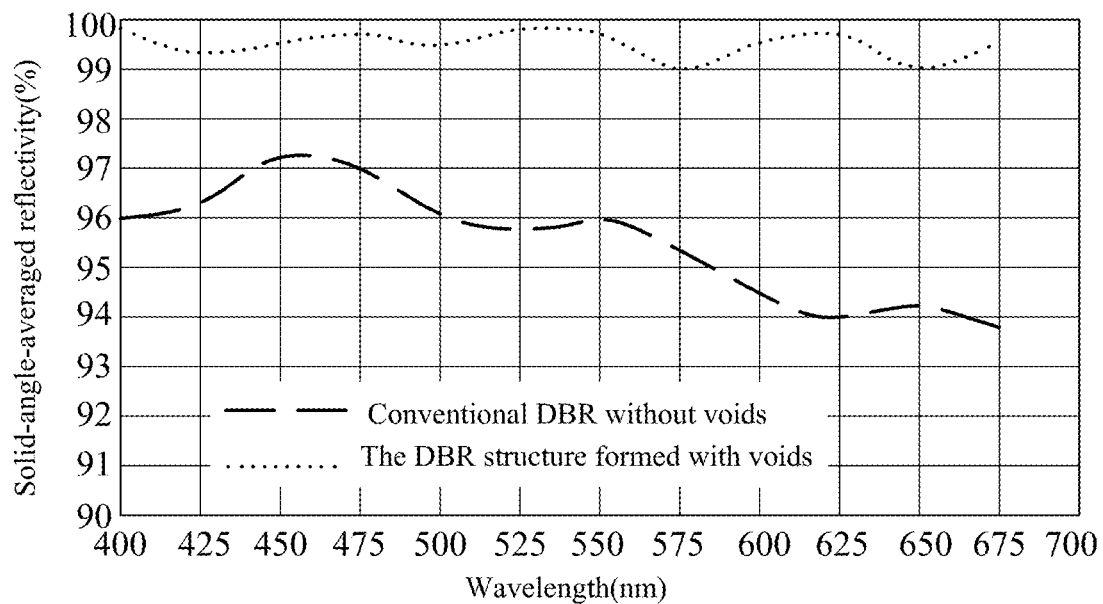
FIG. 3 is a graph showing a simulated solid-angle-averaged reflectivity of a conventional LED and the first embodiment at different wavelengths.

To further demonstrate effect of the DBR structure 106 formed with the voids 106d, the LED of this disclosure and a conventional LED including the DBR structure without the voids 106d are subjected to determination of solid angle-averaged reflectivity under the wavelength ranging from 400 nm to 675 nm using a simulation software (Essential Macleod available from Thin Film Center Inc.). As shown in FIG. 3, compared with the conventional LED, the LED of this disclosure including the DBR structure 106 formed with the voids 106d shows a higher reflectivity, wherein the reflectivity at a blue light wavelength is increased by 2% to 3%, and that at a red light wavelength is increased by 5% to 6%.

The DBR structure 106 may further include a pair of third dielectric layers 106c that are respectively formed as a topmost layer and a lowermost layer of the DBR structure 106. Each of the third dielectric layers 106c has a refractive index smaller than that of each of the second dielectric layers 106b. In certain embodiments, each of the third dielectric layers 106c is made of aluminium oxide. The pair of the third dielectric layers 106c ensures a complete enclosure of the voids 106d within the DBR structure 106, and secures an insulating property of the DBR structure 106, thereby increasing reliability of the LED under an environment of high temperature and high humidity.

The first electrode 109 and the second electrode 110 are disposed on the DBR structure 106 opposite to the epitaxial layered structure. The first and second electrodes 109, 110 are electrically connected to the first semiconductor layer 102 and the second semiconductor layer 104 respectively through the first through hole 107 and the second through hole 108. Each of the first electrode 109 and the second electrode 110 may further include a contact layer and an eutectic layer that are made of a metallic material. The LED may further include a contact electrode layer 105 which is disposed between the second semiconductor layer 104 and the DBR structure 106, and which is covered by the DBR structure 106. The contact electrode layer 105 electrically connects the second semiconductor layer 104 to the second electrode 110. The contact electrode layer 105 forms an ohmic contact with the second semiconductor layer 104. The contact electrode layer 105 may be a transmissible electrode layer which is made of a transmissible metal (such as nickel or gold) or a transmissible conducting oxide optionally doped with a variety of dopants. Examples of the transmissible conducting oxide may include, but are not limited to, indium tin oxide (ITO), zinc oxide, indium zinc tin oxide, indium zinc oxide, zinc tin oxide, gallium indium tin oxide, indium gallium oxide, zinc gallium oxide, aluminium-doped zinc oxide, and fluoride-doped tin oxide. A contact resistance between the contact electrode layer 105 made of a transmissible conducting oxide and the second semiconductor layer 104 is lower than that between the contact electrode layer 105 made of a transmissible metal and the second semiconductor layer 104. That is, the contact electrode layer 105 made of a transmissible conducting oxide has a higher ohmic contact efficiency with the second semiconductor layer 104, and is capable of reducing a forward voltage ($V_f$) of the LED so as to increase light emitting efficiency thereof. In addition, the contact electrode layer 105 made of the transmissible conducting oxide is less susceptible to peel off from the nitride-based semiconductor layers, and thus the resultant LED may have an improved reliability.

In certain embodiments, an electrical resistance between the second electrode 110 and the second semiconductor layer 104 is higher than an electrical resistance between the contact electrode layer 105 and the second semiconductor layer 104, so as to reduce current crowding between the second electrode 110 and the second semiconductor layer 104.

Referring to FIGS. 6 to 12, a method of manufacturing the first embodiment of the LED according to this disclosure includes the following steps.

Figure 6:
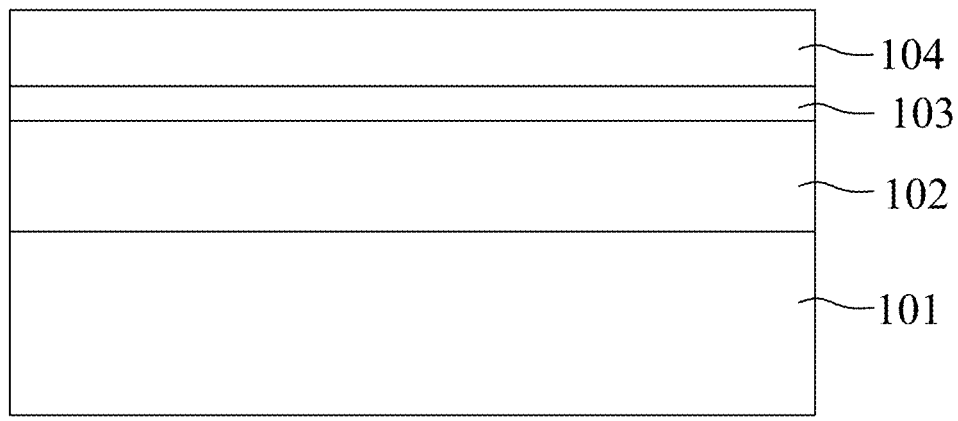
FIGS. 6 to 12 are schematic views illustrating consecutive steps of a method of manufacturing the first embodiment of LED according to the disclosure.

Referring to FIG. 6, the transmissible substrate 101 is first provided, and the epitaxial layered structure is formed on the first surface of the transmissible substrate 101.

Figure 7:
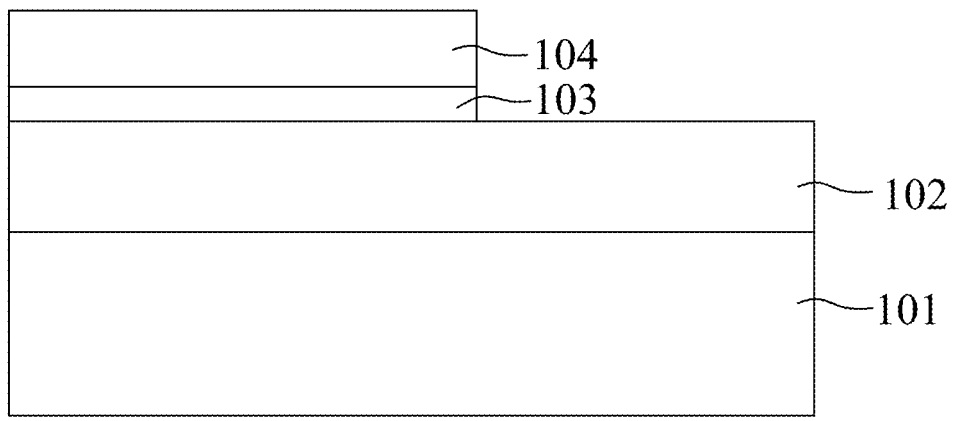

Referring to FIG. 7, the epitaxial layered structure is subjected to an etching process using a mask, so as to form the at least one recess which extends through the second semiconductor layer 104 and the active layer 103 to partially expose the first semiconductor layer 102. The platform (i.e., mesa structure) including the unetched active layer 103 and the second semiconductor layer 104 is thus formed.

Figure 8:
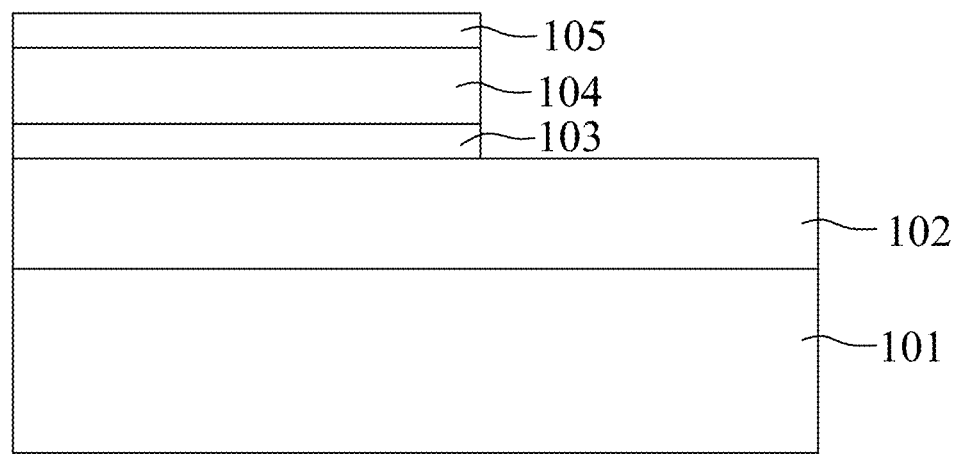

Referring to FIG. 8, the contact electrode layer 105 made of, e.g., ITO, is formed on the second semiconductor layer 104 by, e.g., an evaporation deposition process or sputtering deposition process.

Figure 9:

Referring to FIG. 9, the DBR structure 106 is disposed on the epitaxial layered structure opposite to the transmissible substrate 101, and covers the contact electrode 105. The DBR structure 106 may be formed by e.g., an evaporation deposition process or a sputtering deposition process. In this embodiment, the DBR structure 106 includes the first dielectric layers 106a made of $SiO_2$ and the second dielectric layers 106b made of $TiO_2$ which are alternately-stacked, and the third dielectric layers 106c made of $Al_2O_3$ serving as a topmost layer and a lowermost layer thereof.

Figure 10:
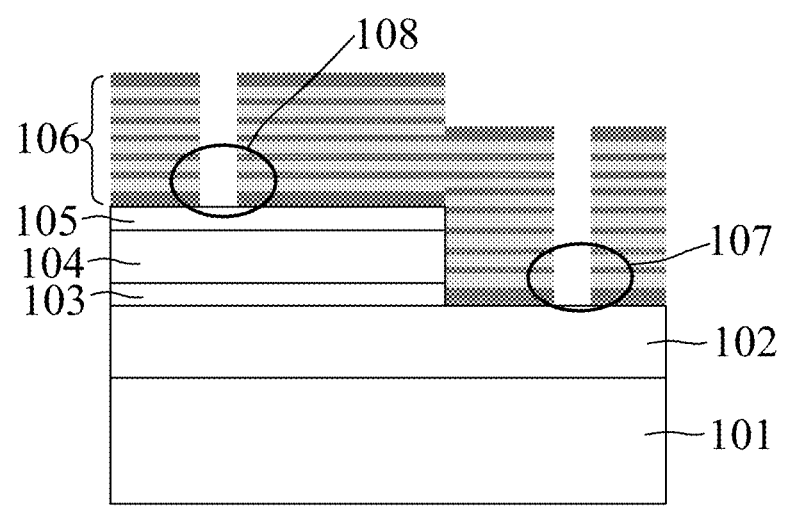

Referring to FIG. 10, the DBR structure 106 is subjected to dry etching so as to form at least one the first through hole 107 and at least one the second through hole 108.

Figure 11:
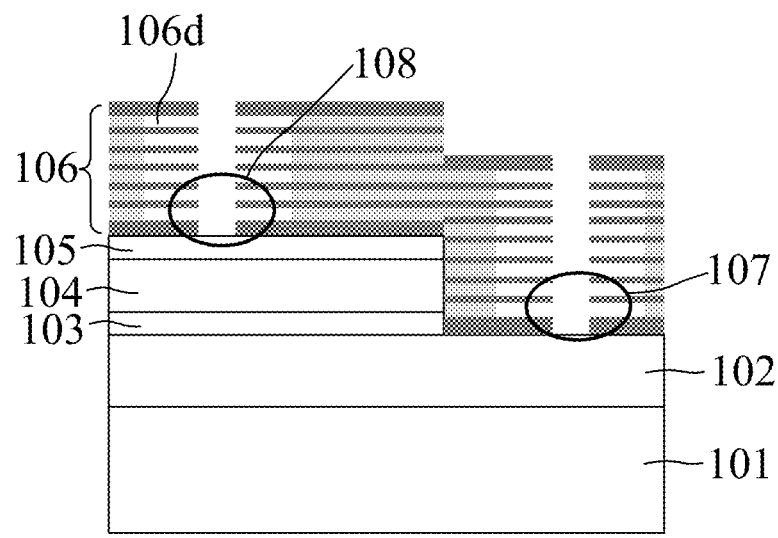

Referring to FIG. 11, the DBR structure 106 is subjected to a wet etching process by adding an etching solution into the first through hole 107 and the second through hole 108. The etching solution only selectively etches the first dielectric layers 106a, and does not etch the second dielectric layers 106b and the third dielectric layers 106c. As such, the voids 106d are only formed in the first dielectric layer 106a, and formed around the first through hole 107 and the second through hole 108 to be communicated in space therewith.

Figure 12:
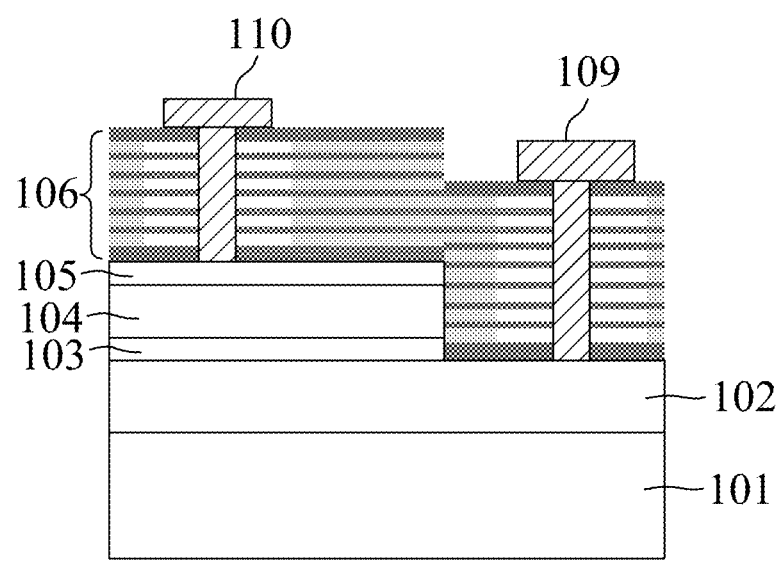

Referring to FIG. 12, the first electrode 109 and the second electrode 110 are formed on the DBR structure 106 opposite to the contact electrode layer 105, and are electrically connected to the first semiconductor layer 102 and the second semiconductor layer 104 respectively through the first through hole 107 and the second through hole 108.

Figure 4:
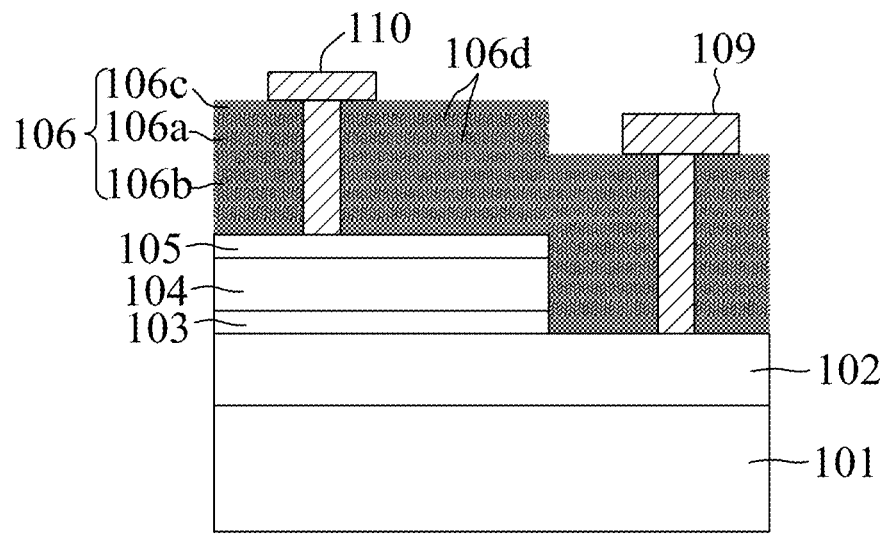
FIG. 4 is a sectional view illustrating a second embodiment of the LED according to the disclosure.

Referring to FIG. 4, a second embodiment of the LED according to this disclosure is generally similar to the first embodiment, except that the plurality of voids 106d are distributed throughout the first dielectric layer 106a. Each of the plurality of voids 106d has a diameter in nanometer-scale, e.g., ranging from 1 nm to 10 nm.

The second embodiment of the LED is made by procedures generally similar to those of the first embodiment, except that the DBR structure 106 of the second embodiment is formed by an evaporation deposition process under a predetermined and controlled condition. Specifically, during evaporation deposition process for each of the first dielectric layers 106a, the deposition parameters are adjusted so as to form a plurality of the voids 106d that are distributed throughout and within the first dielectric layer 106a. That is, the first dielectric layer 106a is formed as a porous structure. In certain embodiments, the voids 106d are evenly distributed throughout the first dielectric layer 106a.

Figure 5:
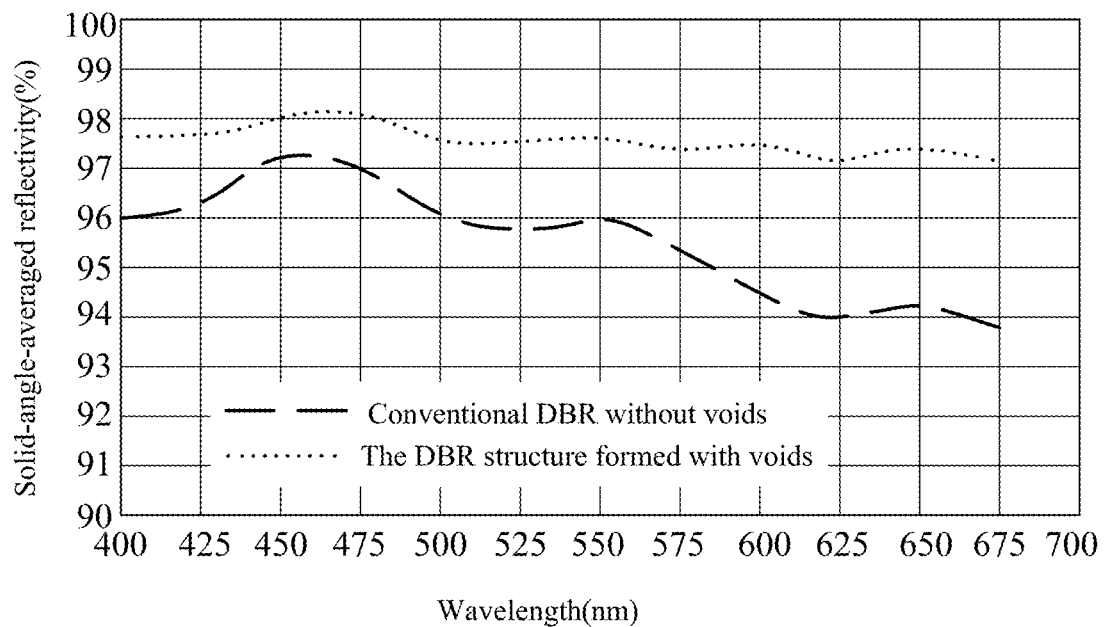
FIG. 5 is a graph showing a simulated solid-angle-averaged reflectivity of a conventional LED and the second embodiment at different wavelengths.

The second embodiment of the LED including the DBR structure 106 is also subjected to the same determination of solid angle-averaged reflectivity as that conducted for the first embodiment. The total volume of the voids 106d may occupy 50% of the total volume of the first dielectric layer 106a. Referring to FIG. 5, as compared to the conventional LED including the DBR structure without voids, the reflectivity of the DBR structure of the second embodiment of the LED at the blue light wavelength is increased by 1% to 2%, and that at the red light wavelength is increased by 2% to 3%.

Figure 13:
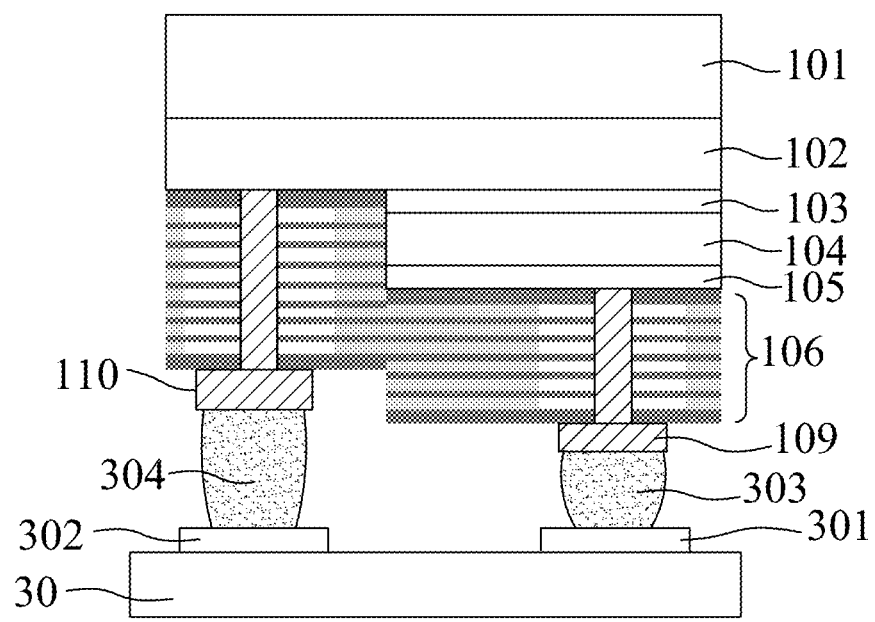
FIG. 13 is a schematic view illustrating an embodiment of an LED packaged module according to the disclosure.

Referring to FIG. 13, an embodiment of an LED packaged module includes a mounting board 30, and at least one aforementioned LED of this disclosure which is mounted on the mounting board 30. The mounting board 30 may be an insulating board that is suitable for use in, e.g., a RGB display monitor or a backlight display monitor. The mounting board 30 includes a first electrode terminal 301 and a second electrode terminal 302 that are electrically isolated from each other, and that are disposed on a surface of the mounting board 30. The LED is mounted onto the surface of the mounting board 30, and the first electrode 109 and the second electrode 110 of the LED are respectively connected to the first electrode terminal 301 and the second electrode terminal 302 through a first connecting element 303 and a second connecting element 304. Each of the first and second connecting element 303, 304 may include, but is not limited to, a soldering material, e.g., an eutectic solder and a reflowed solder.

In certain embodiments, the LED packaged module includes a plurality of LEDs that are arranged in a matrix with a plurality of columns and a plurality of rows, i.e., (an LED array). In other embodiments, for use in the RGB display monitor, the plurality of rows of the LEDs may include at least one row of red LEDs, at least one row of green LEDs and at least one row of blue LEDs. In yet other embodiments, each of the LEDs in the plurality of columns and rows of LEDs are blue LEDs.

The abovementioned LED packaged modules can be widely applied in many aspects, especially in display devices such as RGB display devices or backlight display monitors. Therefore, the present disclosure also provides a display device which includes the embodiment of the LED packaged module.

In conclusion, by forming the voids 106d in the DBR structure 106, a difference of refractive indices of the first and second dielectric layers 106a and 106b is increased, and thus the DBR structure 106 is capable of exhibiting a higher reflectivity, thereby improving the light emitting efficiency of the LED of this disclosure.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that particular feature, structure, characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A light-emitting diode (LED), comprising:
   a transmissible substrate having a first surface;
   an epitaxial layered structure comprising a first semiconductor layer, an active layer and a second semiconductor layer that are sequentially disposed on said first surface of said transmissible substrate in such order;
   a distributed Bragg reflector (DBR) structure disposed on said epitaxial layered structure opposite to said transmissible substrate, having at least one first through hole and at least one second through hole, and formed with a plurality of voids that are filled with air; and
   a first electrode and a second electrode electrically connected to said first semiconductor layer and said second semiconductor layer respectively through said first through hole and said second through hole.

2. The light-emitting diode of claim 1, wherein said DBR structure is made of an insulating dielectric material.

3. The light-emitting diode of claim 2, wherein said DBR structure includes a plurality of pairs of dielectric layers, said dielectric layers in each pair including a first dielectric layer and a second dielectric layer having a refractive index greater than that of said first dielectric layer, said first dielectric layers and said second dielectric layers in said DBR structure are alternately-stacked,
   wherein said voids are only formed in said first dielectric layers.

4. The light-emitting diode of claim 3, wherein said DBR structure includes 3 to 50 pairs of dielectric layers.

5. The light-emitting diode of claim 3, wherein for each of said pairs of dielectric layers, said first dielectric layer is made of a material selected from the group consisting of silicon dioxide, silicon oxynitride, silicon nitride, and combinations thereof.

6. The light-emitting diode of claim 3, wherein for each of said pairs of dielectric layers, said second dielectric layer is made of a material selected from the group consisting of titanium dioxide, niobium pentoxide, tantalum pentoxide, and combinations thereof.

7. The light-emitting diode of claim 3, wherein for each of said pairs of dielectric layers, said first dielectric layer has a thickness larger than that of said second dielectric layer.

8. The light-emitting diode of claim 3, wherein said DBR structure further includes a pair of third dielectric layers respectively formed as a topmost layer and a lowermost layer of said DBR structure, and each of said third dielectric layers has a refractive index smaller than that of each of said second dielectric layers.

9. The light-emitting diode of claim 8, wherein each of said third dielectric layers is made of aluminium oxide.

10. The light-emitting diode of claim 3, wherein said voids are partially embedded in said first dielectric layer and are communicated in space with said first through hole and said second through hole.

11. The light-emitting diode of claim 10, wherein each of said plurality of voids has a diameter ranging from 1 µm to 50 µm.

12. The light-emitting diode of claim 11, wherein each of said plurality of voids has a diameter ranging from 1 nm to 10 nm.

13. The light-emitting diode of claim 3, wherein said plurality of voids are distributed throughout said first dielectric layer.

14. The light-emitting diode of claim 1, wherein said transmissible substrate further has a light-exiting surface opposite to said first surface.

15. The light-emitting diode of claim 1, further comprising a contact electrode layer which is disposed between said second semiconductor layer and said DBR structure and which is covered by said DBR structure.

16. An LED packaged module, comprising a mounting board, and at least one LED as claimed in claim 1 which is mounted on said mounting board.

17. The LED packaged module of claim 16, comprising a plurality of LEDs that are arranged in a matrix with a plurality of columns and a plurality of rows.

18. The LED packaged module of claim 17, wherein said plurality of rows of LEDs include at least one row of red LEDs, at least one row of green LEDs and at least one row of blue LEDs.

19. The LED packaged module of claim 17, wherein each of said LEDs in said plurality of columns and rows of LEDs are blue LEDs.

20. A display device, comprising the LED packaged module as claimed in claim 16.

\* \* \* \* \*